(12) United States Patent
Harris et al.

(10) Patent No.: US 10,542,638 B2
(45) Date of Patent: Jan. 21, 2020

(54) WIRE-SPRING RETAINED HEATSINK INSTALLATION AND REMOVAL TOOL

(71) Applicant: International Business Machines Corporation, Armonk, NY (US)

(72) Inventors: John R. Harris, Houston, TX (US); Robert G. Stevens, IV, Houston, TX (US); Bryan P. Teague, Alvin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/371,833

(22) Filed: Apr. 1, 2019

(65) Prior Publication Data

US 2019/0230818 A1    Jul. 25, 2019

Related U.S. Application Data

(63) Continuation of application No. 15/434,299, filed on Feb. 16, 2017, now Pat. No. 10,257,962.

(51) Int. Cl.
*B25B 27/30* (2006.01)
*H05K 7/20* (2006.01)
*H01L 23/40* (2006.01)

(52) U.S. Cl.
CPC ..... *H05K 7/20418* (2013.01); *H01L 23/4093* (2013.01)

(58) Field of Classification Search
CPC ....... B23P 11/00; B23P 11/005; B23P 11/027; B23Q 1/03; B23Q 1/25; B23Q 1/70; B23Q 3/00; B25B 5/00; B25B 5/04; B25B 1/20
See application file for complete search history.

(56) References Cited

U.S. PATENT DOCUMENTS

| | | | |
|---|---|---|---|
| 2,549,731 | A | 4/1951 | Wattley |
| 4,268,955 | A | 5/1981 | Daniels |
| 4,414,736 | A | 11/1983 | Fieberg et al. |
| 4,778,730 | A | 10/1988 | Zucker |

(Continued)

OTHER PUBLICATIONS

"List of IBM Patents or Patent Applications Treated as Related", Mar. 19, 2019, 2 pages.

(Continued)

*Primary Examiner* — Lee D Wilson
(74) *Attorney, Agent, or Firm* — Francis Lammes; Stephen J. Walder, Jr.; Wenjie Li (57) ABSTRACT

A wire-spring retained heatsink installation and removal tool for installing and removing wire-spring retained heatsinks. The wire-spring retained heatsink installation and removal tool includes a shaped portion that, when placed over a section of a torsion spring of a wire-spring retained heatsink, allows a force to be applied to the torsion spring such that a hook end of the torsion spring is forced into an associated hook on an assembly on which the wire-spring retained heatsink is being attached. The wire-spring retained heatsink installation and removal tool includes a handle that couples to the shaped portion thereby allowing a user to grasp the wire-spring retained heatsink installation and removal tool in order to apply the force necessary to engage the hook end of the torsion spring into the associated hook on the assembly on which the wire-spring retained heatsink is being attached.

17 Claims, 7 Drawing Sheets

(56) References Cited

U.S. PATENT DOCUMENTS

| | | | |
|---|---|---|---|
| 4,838,595 | A | 6/1989 | Spillar |
| 5,707,053 | A | 1/1998 | Plunkett et al. |
| 5,902,015 | A | 5/1999 | Allcock |
| 6,098,276 | A | 8/2000 | Espiritu |
| 6,219,238 | B1 | 4/2001 | Andros et al. |
| 6,311,589 | B1 | 11/2001 | Schmitt |
| 6,442,816 | B1 | 9/2002 | Kao |
| 6,732,426 | B2 | 5/2004 | Adams |
| 6,876,530 | B2 | 4/2005 | Parker et al. |
| 7,275,318 | B2 | 10/2007 | Chu et al. |
| 8,995,132 | B2 | 3/2015 | Kataoka et al. |
| 10,257,962 | B2 * | 4/2019 | Harris ................ H01L 23/4093 |
| 2007/0062017 | A1 | 3/2007 | Dycus et al. |
| 2013/0221593 | A1 | 8/2013 | Melchior |
| 2014/0036451 | A1 | 2/2014 | Simon et al. |
| 2015/0020650 | A1 | 1/2015 | Ford |
| 2015/0042027 | A1 | 2/2015 | Dowd et al. |
| 2018/0235104 | A1 * | 8/2018 | Harris ................ H01L 23/4093 |
| 2019/0230818 | A1 * | 7/2019 | Harris ................ H01L 23/4093 |

OTHER PUBLICATIONS

"Test Clips (plunger style hook grabbers)", Gogo: Tronics, http://sparks.gogo.co.nz/6-of-Test-Clips-plunger-style-hook-grabbers-165.html, retrieved from internet Jun. 24, 2016, 1 page.

* cited by examiner

WIRE-SPRING RETAINED HEATSINK INSTALLATION AND REMOVAL TOOL

BACKGROUND

The present application relates generally to a wire-spring retained heatsink installation and removal tool and more specifically to install and remove wire-spring retained heatsinks using the wire-spring retained heatsink installation and removal tool.

A heatsink is a passive heat exchanger that transfers heat generated by a device, such as an electronic device, mechanical device, or the like, to a medium, often air or a liquid coolant, where the heat is dissipated away from the device, thereby allowing regulation of the device's temperature at optimal levels. In computers, heatsinks are used to cool central processing units or graphics processors. Heatsinks are used with high-power semiconductor devices such as power transistors and optoelectronics such as lasers and light emitting diodes (LEDs), where the heat dissipation ability of the component itself is insufficient to moderate its temperature.

A heatsink is designed to maximize its surface area in contact with the cooling medium surrounding it, such as the air. Air velocity, choice of material, protrusion design, and surface treatment are factors that affect the performance of a heatsink. Heatsink attachment methods and thermal interface materials also affect the die temperature of the integrated circuit. Thermal adhesive or thermal grease improve the heatsink's performance by filling air gaps between the heatsink and the heat spreader on the device. A heatsink is usually made out of copper and/or aluminum. Copper is used because it has many desirable properties for thermally efficient and durable heat exchangers. First and foremost, copper is an excellent conductor of heat. This means that copper's high thermal conductivity allows heat to pass through it quickly. Aluminum is used in applications where weight is a big concern.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a wire-spring retained heatsink installation and removal tool for installing and removing wire-spring retained heatsinks is provided. The wire-spring retained heatsink installation and removal tool comprises a shaped portion that, when placed over a section of a torsion spring of a wire-spring retained heatsink, allows a force to be applied to the torsion spring such that a hook end of the torsion spring is forced into an associated hook on an assembly on which the wire-spring retained heatsink is being attached. The wire-spring retained heatsink installation and removal tool also comprises a handle that couples to the shaped portion thereby allowing a user to grasp the wire-spring retained heatsink installation and removal tool in order to apply the force necessary to engage the hook end of the torsion spring into the associated hook on the assembly on which the wire-spring retained heatsink is being attached.

In another illustrative embodiment, another wire-spring retained heatsink installation and removal tool for installing and removing wire-spring retained heatsinks is provided. The wire-spring retained heatsink installation and removal tool comprises a handle that couples to a circularly-shaped tip and a spring-loaded plunger coupled to an ejector plate in the circularly-shaped tip via a stiff wire. The circularly-shaped tip that is formed such that, when force is applied to the wire-spring retained heatsink installation and removal tool, a hook end of a torsion spring of a wire-spring retained heatsink, while in the circularly-shaped tip, is forced through an associated hook on an assembly on which the wire-spring retained heatsink is being attached and, when the spring-loaded plunger is depressed, the ejector plate forces the hook end of the torsion spring out of the circularly-shaped tip in order for the hook end of the torsion spring to engage the associated hook of the assembly.

In yet another illustrative embodiment, yet another wire-spring retained heatsink installation and removal tool for installing and removing wire-spring retained heatsinks is provided. The wire-spring retained heatsink installation and removal tool comprises a handle that couples to a tip and a spring-loaded plunger coupled to a set of spring-loaded hooks via a stiff wire. The spring-loaded plunger, when depressed, opens the set of spring-loaded hooks so that an arm section of a torsion spring of a wire-spring retained heatsink into an associated hook on an assembly on which the wire-spring retained heatsink is being attached is grasped between the set of spring-loaded hooks and, when released, the spring-loaded hooks close around the arm section and pull the arm section such that the arm section comes into contact with a tip of the wire-spring retained heatsink installation and removal tool. When force is applied to the arm section of the torsion spring of the wire-spring retained heatsink via the wire-spring retained heatsink installation and removal tool, the hook end of the torsion spring is secured into the associated hook on the assembly on which the wire-spring retained heatsink is being attached.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide wire-spring retained heatsink installation and removal tools for installing and removing wire-spring retained heatsinks. As noted above, heatsink attachment methods affect the die temperature of the device to which the heatsink is attached. However, securing such wire-spring retained heatsinks, also referred to as 'z-clip heatsinks', to the assembly on which the heatsink is to be installed may be difficult. That is, the torque needed to overpower the torsion spring tension of a wire-spring retained heatsink may leave the installer with sore fingers and, sometimes, may be impossible to install with bare hands at all. If an installer is using a make-shift tool, such as a screwdriver, the slippage of such a make-shift tool may result in damage or injury to the assembly on which the heatsink is to be installed, other components on the assembly, and/or the installer.

The illustrative embodiments provide wire-spring retained heatsink installation and removal tools for installing and removing wire-spring retained heatsinks. In order to prevent damage or injury that may occur from using make-shift tools, the wire-spring retained heatsink installation and removal tools of the illustrative embodiments increases a static frictional coefficient both with and without significant applied force on the wire-spring retained heatsink installation and removal tools. Use of the wire-spring retained heatsink installation and removal tools shift the exertion from the thumbs or fingers to the forearm and/or upper arm. Thus, the user using the wire-spring retained heatsink installation and removal tools is able to overpower the wire-spring retained heatsink's torsion spring tension with less effort.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Moreover, it should be appreciated that the use of the term "engine," if used herein with regard to describing embodiments and features of the invention, is not intended to be limiting of any particular implementation for accomplishing and/or performing the actions, steps, processes, etc., attributable to and/or performed by the engine. An engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular engine is, unless otherwise specified, for purposes of convenience of reference and not intended to be limiting to a specific implementation. Additionally, any functionality attributed to an engine may be equally performed by multiple engines, incorporated into and/or combined with the functionality of another engine of the same or different type, or distributed across one or more engines of various configurations.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 1:
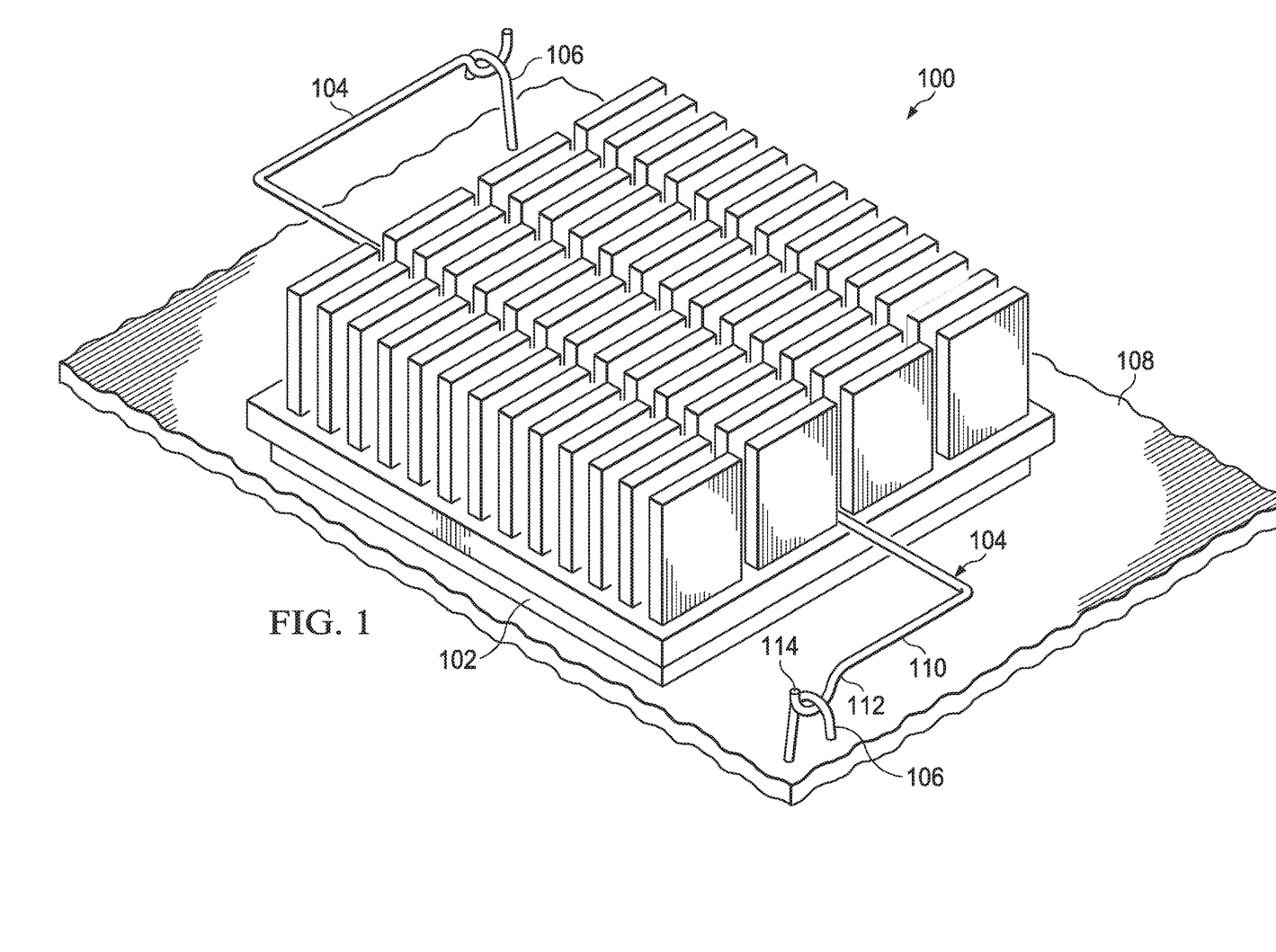
FIG. 1 depicts one example of a wire-spring retained heatsink installed on an assembly in accordance with an illustrative embodiment.

FIG. 1 depicts one example of a wire-spring retained heatsink installed on an assembly in accordance with an illustrative embodiment. As is illustrated, wire-spring retained heatsink 100 is secured atop of a device 102, such as an electronic device, mechanical device, or the like, by securing each of torsion springs 104 to hooks 106 on assembly 108. In accordance with the illustrative embodiments, securing the hook end of torsion springs 104 onto respective one of hooks 106 may be performed by exerting force on an arm section 110 of torsion springs 104, a bend section 112 of torsion spring 104, or a hook end 114 of torsion springs 104 using a respective one of the wire-spring retained heatsink installation and removal tools illustrated in FIGS. 2-7 as will be described hereafter. While hooks 106 are shown as "J"-hooks with an opening to one side, the illustrative embodiments are recognize that completely closed hooks may also be utilized.

Some of the wire-spring retained heatsink installation and removal tools described in FIGS. 2-7 rely on their shape to sufficiently retain the torsion spring 104 during manipulation, with or without rubber relying on rubber coatings to prevent slippage. While some of the wire-spring retained heatsink installation and removal tools described in FIGS. 2-7 are illustrated as a standard ¼ inch interchangeable driver bits that may fit in commonly available compatible screwdriver handle, those the wire-spring retained heatsink installation and removal tools may also be an entire tool as opposed to being an interchangeable bit.

Figure 2:
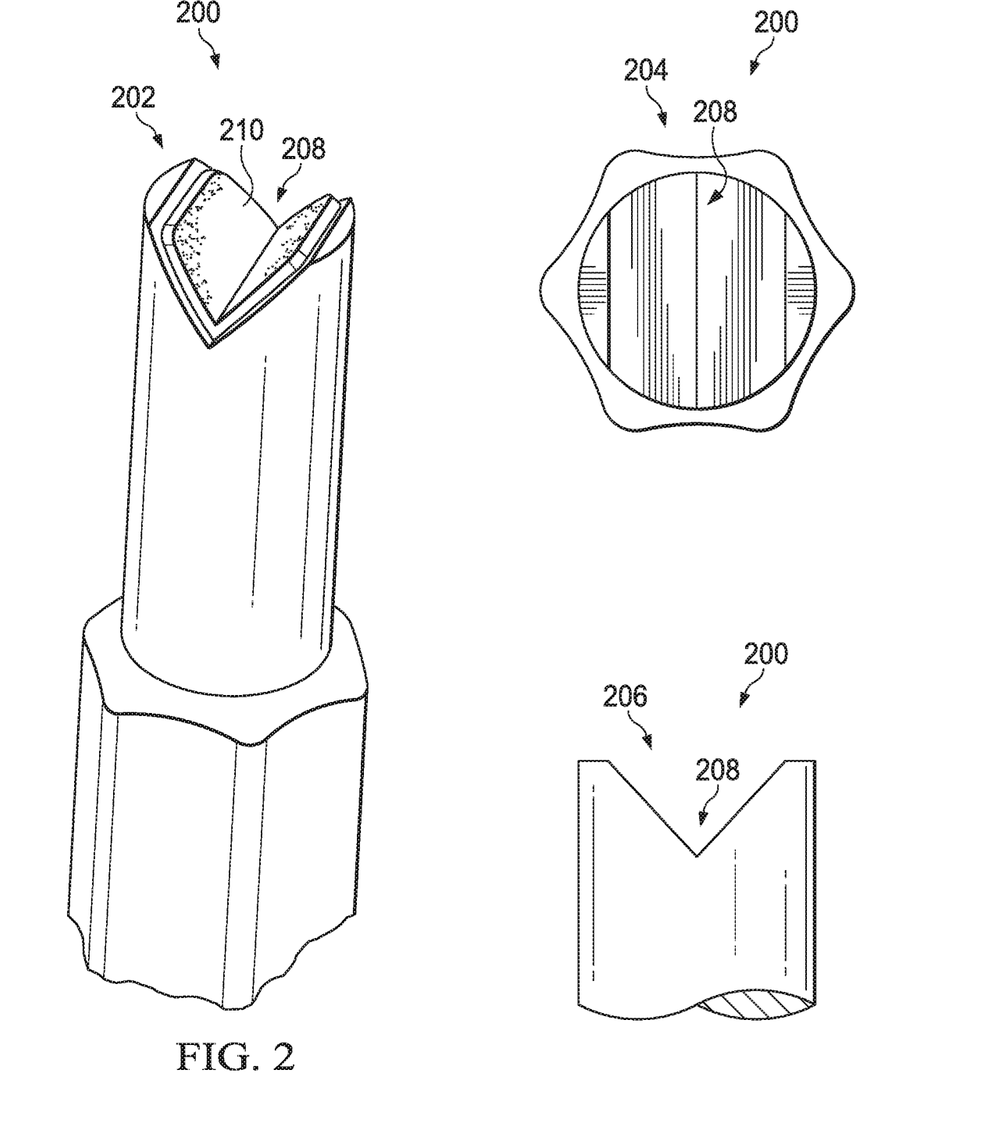
FIG. 2 depicts a first exemplary embodiment a wire-spring retained heatsink installation and removal tool for installing and removing a wire-spring retained heatsink in accordance with an illustrative embodiment.

FIG. 2 depicts a first exemplary embodiment a wire-spring retained heatsink installation and removal tool for installing and removing a wire-spring retained heatsink in accordance with an illustrative embodiment. Wire-spring retained heatsink installation and removal tool 200 is illustrated in a three-dimensional view 202, an overhead view 204, and a side view 206. The tip of wire-spring retained heatsink installation and removal tool 200 has a V-notch 208 that, when placed over an arm section, such as arm section 110 of FIG. 1, of a torsion spring of the wire-spring retained heatsink allowing force to be applied to the arm section so as to secure the hook end of the torsion spring onto a respective hook on the assembly on which the wire-spring retained heatsink is to be attached. As is illustrated in the three-dimensional view 202, the V-Notch 208 may be coated with an anti-slip material 210, such as rubber, latex, butyl, or the like, to avoid slipping along the length of the arm section.

Figure 3:
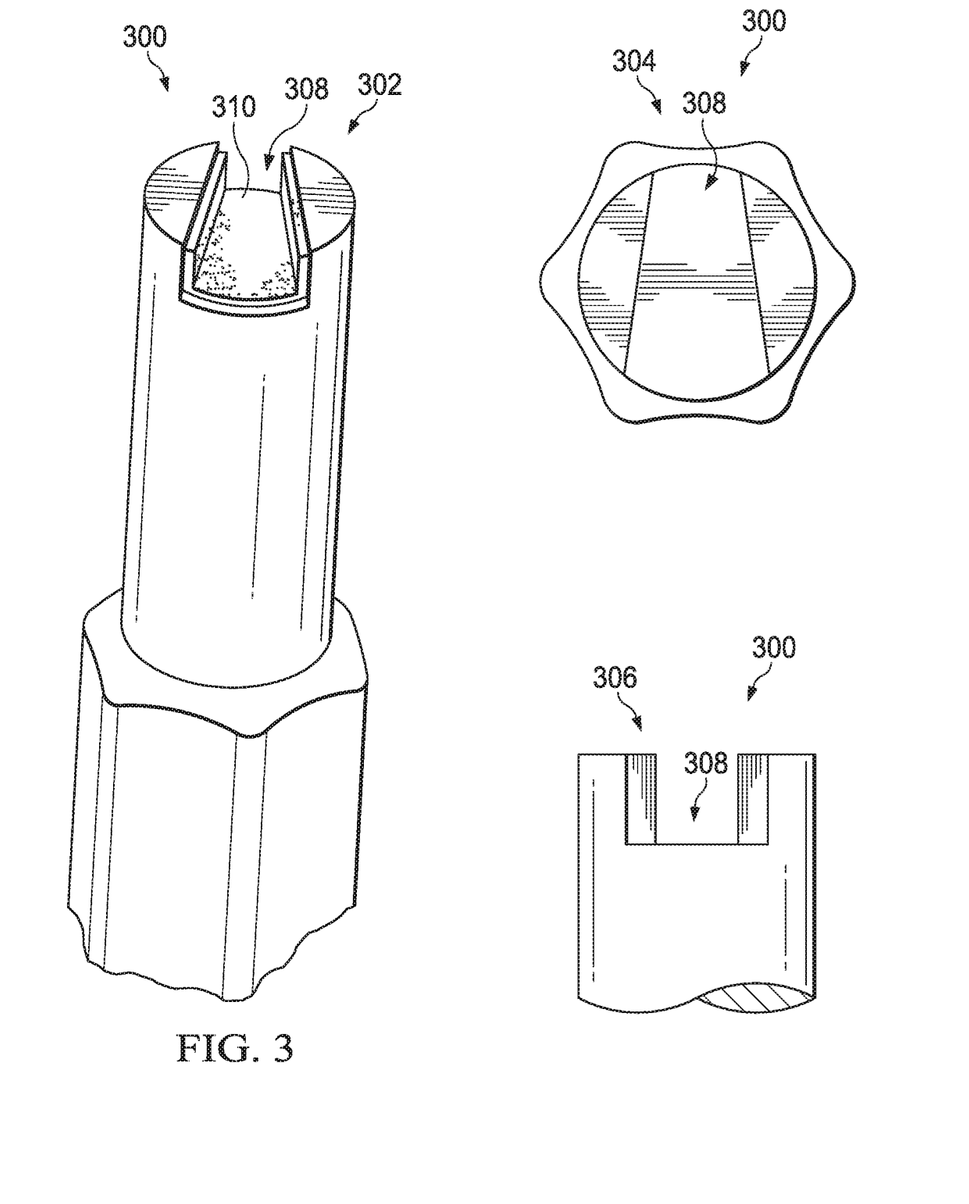
FIG. 3 depicts s second exemplary embodiment a wire-spring retained heatsink installation and removal tool for installing and removing a wire-spring retained heatsink in accordance with an illustrative embodiment.

FIG. 3 depicts s second exemplary embodiment a wire-spring retained heatsink installation and removal tool for installing and removing a wire-spring retained heatsink in accordance with an illustrative embodiment. Wire-spring retained heatsink installation and removal tool 300 is illustrated in a three-dimensional view 302, an overhead view 304, and a side view 306. The tip of wire-spring retained heatsink installation and removal tool 300 has a tapered slot 308 that, when placed over an arm section, such as arm section 110 of FIG. 1, of a torsion spring of the wire-spring retained heatsink allowing force to be applied to the arm section so as to secure the hook end of the torsion spring onto a respective hook on the assembly on which the wire-spring retained heatsink is to be attached. The width of tapered slot 308 is dependent on the diameter of the torsion spring so as to cause a binding effect in an event that wire-spring retained heatsink installation and removal tool 300 were to slide along the arm section of the torsion spring. As is illustrated in the three-dimensional view 302, the tapered slot 308 may be coated with an anti-slip material 310, such as rubber, latex, butyl, or the like, to avoid slipping along the length of the arm section.

Figure 4:
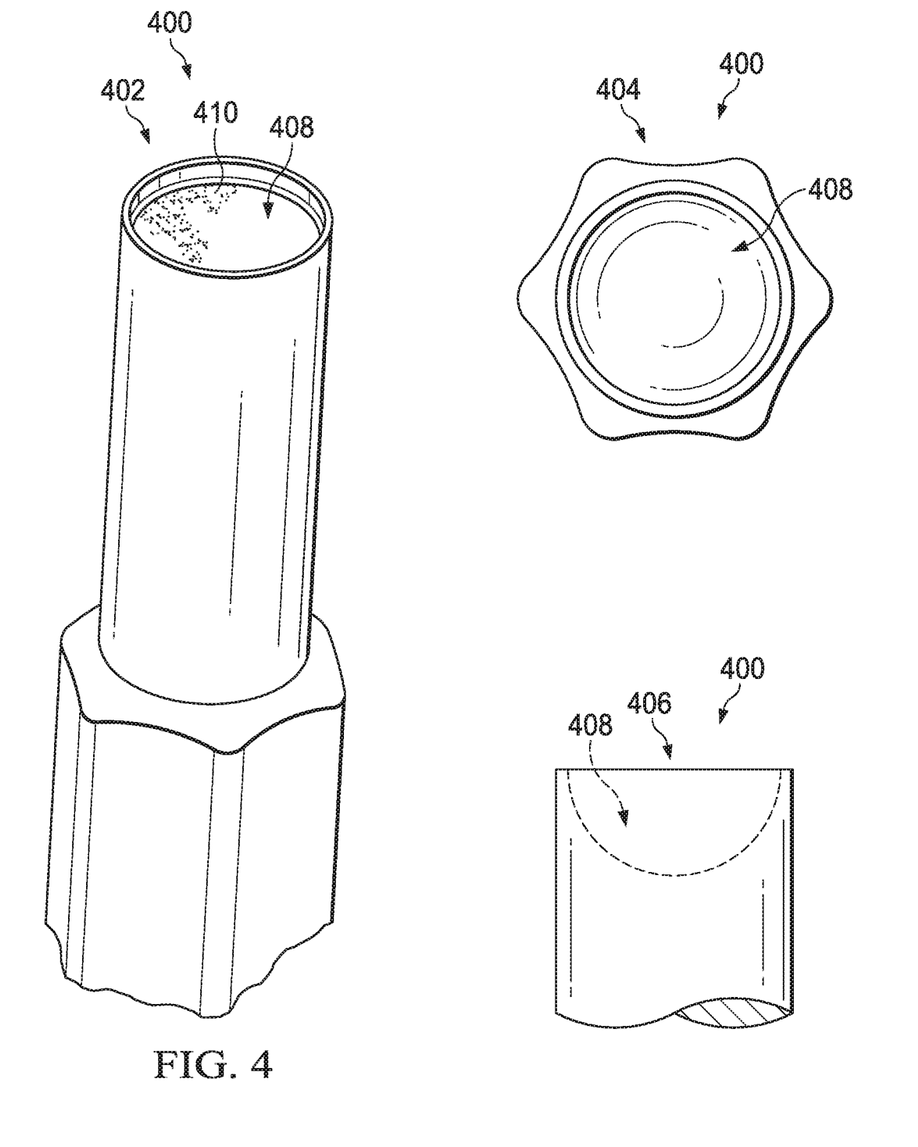
FIG. 4 depicts a third exemplary embodiment a wire-spring retained heatsink installation and removal tool for installing and removing a wire-spring retained heatsink in accordance with an illustrative embodiment.

FIG. 4 depicts a third exemplary embodiment a wire-spring retained heatsink installation and removal tool for installing and removing a wire-spring retained heatsink in accordance with an illustrative embodiment. Wire-spring retained heatsink installation and removal tool 400 is illustrated in a three-dimensional view 402, an overhead view 404, and a side view 406. The tip of wire-spring retained heatsink installation and removal tool 400 has a cup shape thereby forming a cup-shaped tip 408 that, when placed over a bend section, such as bend section 112 of FIG. 1, of a torsion spring of the wire-spring retained heatsink allowing force to be applied to the bend section so as to secure the hook end of the torsion spring onto a respective hook on the assembly on which the wire-spring retained heatsink is to be attached. As is illustrated in the three-dimensional view 402, the cup-shaped tip 408 may be coated with an anti-slip material 410, such as rubber, latex, butyl, or the like, to avoid slipping along the bend section.

Figure 5:
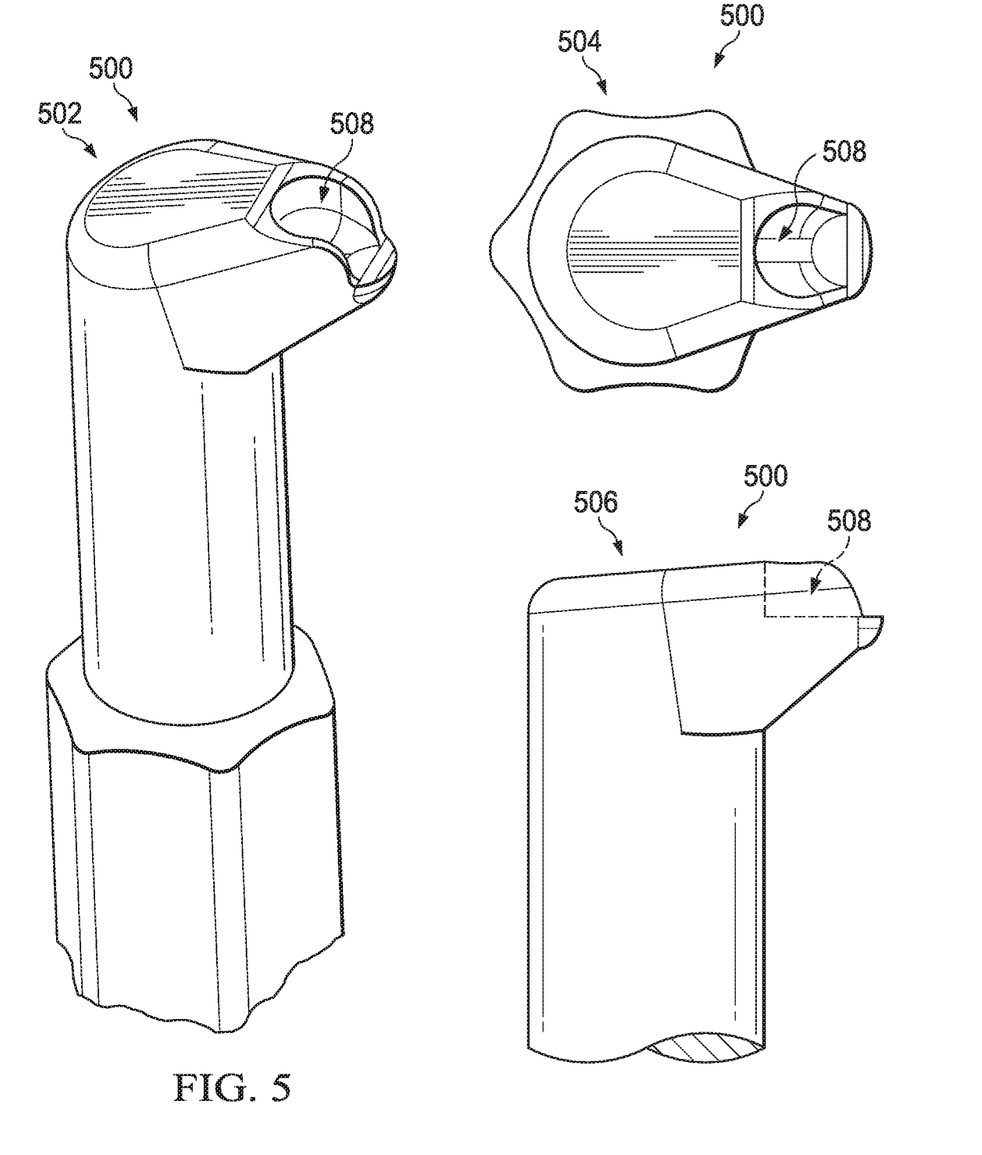
FIG. 5 depicts a fourth exemplary embodiment a wire-spring retained heatsink installation and removal tool for installing and removing a wire-spring retained heatsink in accordance with an illustrative embodiment.

FIG. 5 depicts a fourth exemplary embodiment a wire-spring retained heatsink installation and removal tool for installing and removing a wire-spring retained heatsink in accordance with an illustrative embodiment. Wire-spring retained heatsink installation and removal tool 500 is illustrated in a three-dimensional view 502, an overhead view 504, and a side view 506. The tip of wire-spring retained heatsink installation and removal tool 500 has a circularly-shaped tip 508 partially surrounded by a walled structure that presses on the hook end, such as hook end 114 of FIG. 1, of a torsion spring of the wire-spring retained heatsink allowing force to be applied to the hook end so as to secure the hook end of the torsion spring onto a respective hook on the assembly on which the wire-spring retained heatsink is to be attached. As stated previously, the hook on the assembly may be either a "J"-hook with an opening to one side or a completely closed hook. When the hook on the assembly is a "J"-hook, the circularly-shaped tip 508 presses on the hook end of the torsion spring and lowers the tip through the opening on one side of the "J"-hook thereby allowing a hook portion of the torsion spring to engage the hook of the assembly. When the hook on the assembly is completely closed hook, the circularly-shaped tip 508 presses on the hook end of the torsion spring and retains the hook end of the torsion spring physically within the circularly-shaped tip 508. The circularly-shaped tip 508 is then passed through the hook on the assembly and, when the tip is tilted past a predetermined angle, the hook end of the torsion spring is allowed to slip out and into place such that the hook portion of the torsion spring engages the hook of the assembly.

Figure 6:
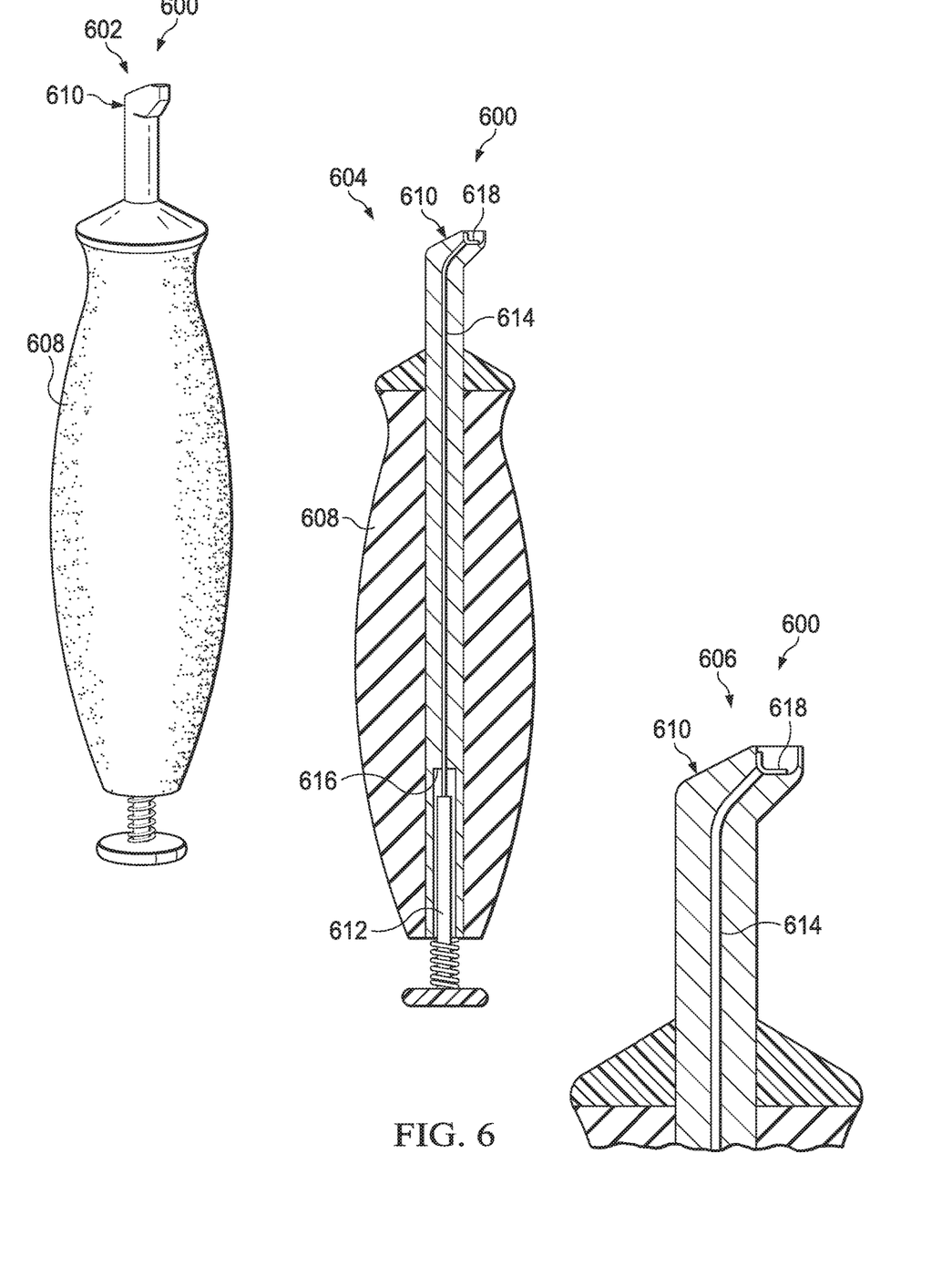
FIG. 6 depicts a fifth exemplary embodiment a wire-spring retained heatsink installation and removal tool for installing and removing a wire-spring retained heatsink in accordance with an illustrative embodiment.

FIG. 6 depicts a fifth exemplary embodiment a wire-spring retained heatsink installation and removal tool for installing and removing a wire-spring retained heatsink in accordance with an illustrative embodiment. Wire-spring retained heatsink installation and removal tool 600 is illustrated in a three-dimensional view 602, a cross-sectional view 604, and an enlarged tip view 606. Wire-spring retained heatsink installation and removal tool 600 comprises a handle 608 coupled to a circularly-shaped tip 610 fully surrounded by a walled structure. As is illustrated in cross-sectional view 606, a spring-loaded plunger 612 with an attached stiff wire 614 traverses a bore 616 via the length of handle 608 up through the circularly-shaped tip 610. The end of the stiff wire 614 is then coupled to an ejector plate 618. Thus, when spring-loaded plunger 612 is depressed, force is transferred through the stiff wire 614 to the ejector plate 618 forcing the hook end, such as hook end 114 of FIG. 1, of the torsion spring from the circularly-shaped tip 610.

That is, as stated previously, the hook on the assembly may be either a "J"-hook with an opening to one side or a completely closed hook. When the hook on the assembly is a "J"-hook, the circularly-shaped tip 610 presses on the hook end of the torsion spring and lowers the tip through the opening on one side of the "J"-hook thereby allowing a hook portion of the torsion spring to engage the hook of the assembly. However, when the hook on the assembly is completely closed hook, the circularly-shaped tip 610 presses on the hook end of the torsion spring and retains the hook end of the torsion spring physically with the circularly-shaped tip 610. The circularly-shaped tip 610 is then passed through the hook on the assembly and, once the hook end of the torsion spring has passed through the hook on the assembly, the spring-loaded plunger 612 is depressed transferring a force through the stiff wire 614 to the ejector plate 618 forcing the hook end of the torsion spring from the circularly-shaped tip 610. By providing the ejector mechanism via the spring-loaded plunger 612, the stiff wire 614, and the ejector plate 618, the wire-spring retained heatsink installation and removal tool 600 does not need to be tipped to release the hook end of the torsion spring in order for the hook portion of the torsion spring to engage the hook of the assembly.

Figure 7:
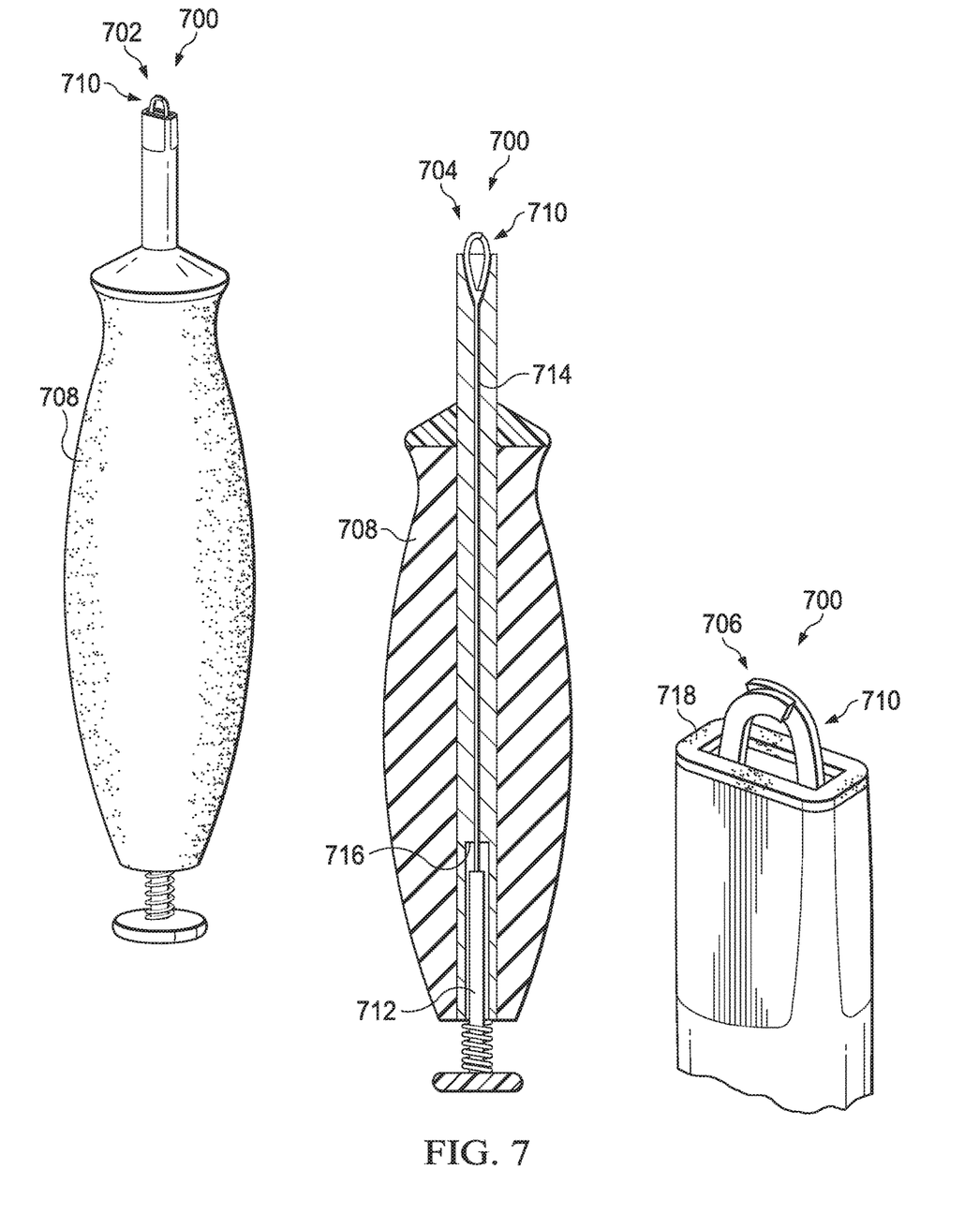
FIG. 7 depicts a sixth exemplary embodiment a wire-spring retained heatsink installation and removal tool for installing and removing a wire-spring retained heatsink in accordance with an illustrative embodiment.

FIG. 7 depicts a sixth exemplary embodiment a wire-spring retained heatsink installation and removal tool for installing and removing a wire-spring retained heatsink in accordance with an illustrative embodiment. Wire-spring retained heatsink installation and removal tool 700 is illustrated in a three-dimensional view 702, a cross-sectional view 704, and an enlarged tip view 706. Wire-spring retained heatsink installation and removal tool 700 comprises a handle 708 coupled to a set of spring-loaded hooks 710. As is illustrated in cross-sectional view 706, a spring-loaded plunger 712 with an attached stiff wire 714 traverses a bore 716 via the length of handle 708 up through the spring-loaded hooks 710. When spring-loaded plunger 712 is depressed, force is transferred through the stiff wire 714 forcing the spring-loaded hooks 710 out of the tip of the wire-spring retained heatsink installation and removal tool 700 causing the spring-loaded hooks 710 to open.

When opened, the opening between the spring-loaded hooks 710 is placed over an arm section, such as arm section 110 of FIG. 1, of a torsion spring of the wire-spring retained heatsink. The spring-loaded plunger 712 is then released thereby causing the spring-loaded hooks 710 to close around the arm section and pull the arm section such that the arm section comes into contact with the tip of the wire-spring retained heatsink installation and removal tool 700. The tip of the wire-spring retained heatsink installation and removal tool 700 may be coated with an anti-slip material 718, such as rubber, latex, butyl, or the like, to avoid slipping along the arm section.

Once the arm section is enclosed within the spring-loaded hooks 710, force is applied to the arm section thought the wire-spring retained heatsink installation and removal tool 700 so as to secure the hook end of the torsion spring onto a respective hook on the assembly on which the wire-spring retained heatsink is to be attached. The spring-loaded plunger 712 is then depressed forcing the stiff wire 714 though the boar 716 such that the spring-loaded hooks 710 exit the tip of the wire-spring retained heatsink installation and removal tool 700 causing the spring-loaded hooks 710 to open so that the wire-spring retained heatsink installation and removal tool 700 may be removed from the arm section of the torsion spring.

It should be appreciated that the above description provides examples of configurations of the wire-spring retained heatsink installation and removal tool of the present invention, but the present invention is not limited to these particular example configurations. To the contrary, many modifications can be made to the example configurations without departing from the spirit and scope of the illustrative embodiments.

Thus, the illustrative embodiments provide wire-spring retained heatsink installation and removal tools for installing and removing wire-spring retained heatsinks. In order to prevent damage or injury that may occur from using makeshift tools, the wire-spring retained heatsink installation and removal tools of the illustrative embodiments increases a static frictional coefficient both with and without significant applied force on the wire-spring retained heatsink installation and removal tools. Use of the wire-spring retained heatsink installation and removal tools shift the exertion from the thumbs or fingers to the forearm and/or upper arm. Thus, the user using the wire-spring retained heatsink installation and removal tools is able to overpower the wire-spring retained heatsink's torsion spring tension with less effort.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A wire-spring retained heatsink installation and removal tool for installing and removing wire-spring retained heatsinks, the wire-spring retained heatsink installation and removal tool comprising:

a shaped portion that, when placed over a section of a torsion spring of a wire-spring retained heatsink, allows a force to be applied to the torsion spring such that a hook end of the torsion spring is forced into an associated hook on an assembly on which the wire-spring retained heatsink is being attached, wherein the shaped portion is cup shaped thereby forming a cup-shaped tip and wherein the cup-shaped tip is placed on a bend section of the torsion spring of the wire-spring retained heatsink allowing force to be applied to the bend section so as to secure the hook end of the torsion spring into the associated hook on the assembly on which the wire-spring retained heatsink is being attached; and a cylindrical portion that encompasses the shaped portion on a first end of the cylindrical portion;

a handle that couples to a second end of the cylindrical portion thereby allowing a user to grasp the wire-spring retained heatsink installation and removal tool in order to apply the force necessary to engage the hook end of the torsion spring into the associated hook on the assembly on which the wire-spring retained heatsink is being attached.

2. The wire-spring retained heatsink installation and removal tool of claim 1, wherein the cup-shaped tip is coated with an anti-slip material and wherein the anti-slip material is one of rubber, latex, or butyl.

3. A wire-spring retained heatsink installation and removal tool for installing and removing wire-spring retained heatsinks, the wire-spring retained heatsink installation and removal tool comprising:

a shaped portion that, when placed over a section of a torsion spring of a wire-spring retained heatsink, allows a force to be applied to the torsion spring such that a hook end of the torsion spring is forced into an associated hook on an assembly on which the wire-spring retained heatsink is being attached, wherein the shaped portion is a circularly-shaped tip and wherein the circularly-shaped tip is placed on an hook end of the torsion spring of the wire-spring retained heatsink allowing force to be applied to the hook end so as to secure the hook end of the torsion spring into the associated hook on the assembly on which the wire-spring retained heatsink is being attached; and a cylindrical portion that encompasses the shaped portion on a first end of the cylindrical portion;

a handle that couples to a second end of the cylindrical portion thereby allowing a user to grasp the wire-spring retained heatsink installation and removal tool in order to apply the force necessary to engage the hook end of the torsion spring into the associated hook on the assembly on which the wire-spring retained heatsink is being attached.

4. The wire-spring retained heatsink installation and removal tool of claim 3, wherein the circularly-shaped tip is formed such that, when force is applied to the wire-spring retained heatsink installation and removal tool, the hook end of the torsion spring, while in the circularly-shaped tip, is forced through the associated hook on the assembly and, when the wire-spring retained heatsink installation and removal tool is tilted, the hook end of the torsion spring slides out of the circularly-shaped tip.

5. The wire-spring retained heatsink installation and removal tool of claim 3, wherein a walled structure partially surrounds the circularly-shaped tip.

6. The wire-spring retained heatsink installation and removal tool of claim 3, wherein the shaped portion and the cylindrical portion are part of an interchangeable bit that slides into a receiving portion of the handle.

7. The wire-spring retained heatsink installation and removal tool of claim 3, wherein the cylindrical portion is permanently coupled to the handle.

8. A wire-spring retained heatsink installation and removal tool for installing and removing wire-spring retained heatsinks, the wire-spring retained heatsink installation and removal tool comprising:

a handle that couples to a circularly-shaped tip; and a spring-loaded plunger coupled to an ejector plate in the circularly-shaped tip via a stiff wire, wherein:

the circularly-shaped tip that is formed such that, when force is applied to the wire-spring retained heatsink installation and removal tool, a hook end of a torsion spring of a wire-spring retained heatsink, while in the circularly-shaped tip, is forced through an associated hook on an assembly on which the wire-spring retained heatsink is being attached and, when the spring-loaded plunger is depressed, the ejector plate forces the hook end of the torsion spring out of the circularly-shaped tip in order for the hook end of the torsion spring to engage the associated hook of the assembly.

9. The wire-spring retained heatsink installation and removal tool of claim 8, wherein a walled structure fully surrounds the circularly-shaped tip.

10. The wire-spring retained heatsink installation and removal tool of claim 8, wherein the spring-loaded plunger and the stiff wire traverse a bore through the length of the handle.

11. The wire-spring retained heatsink installation and removal tool of claim 8, wherein the handle allows a user to grasp the wire-spring retained heatsink installation and removal tool in order to apply the force necessary to engage the hook end of the torsion spring of the wire-spring retained heatsink into the associated hook on the assembly on which the wire-spring retained heatsink is being attached.

12. A wire-spring retained heatsink installation and removal tool for installing and removing wire-spring retained heatsinks, the wire-spring retained heatsink installation and removal tool comprising:

a handle that couples to a tip; and a spring-loaded plunger coupled to a set of spring-loaded hooks via a stiff wire, wherein:

the spring-loaded plunger, when depressed, opens the set of spring-loaded hooks so that an arm section of a torsion spring of a wire-spring retained heatsink is grasped between the set of spring-loaded hooks and, when released, the spring-loaded hooks close around the arm section and pull the arm section such that the arm section comes into contact with a tip of the wire-spring retained heatsink installation and removal tool, and when force is applied to the arm section of the torsion spring of the wire-spring retained heatsink via the wire-spring retained heatsink installation and removal tool, the hook end of the torsion spring is secured into the associated hook on the assembly on which the wire-spring retained heatsink is being attached.

13. The wire-spring retained heatsink installation and removal tool of claim 12, wherein the tip of the wire-spring retained heatsink installation and removal tool is coated with an anti-slip material and wherein the anti-slip material is one of rubber, latex, or butyl.

14. The wire-spring retained heatsink installation and removal tool of claim 12, wherein the spring-loaded plunger and the stiff wire traverse a bore through the length of the handle.

15. The wire-spring retained heatsink installation and removal tool of claim 12, wherein the handle allows a user to grasp the wire-spring retained heatsink installation and removal tool in order to apply the force necessary to engage the hook end of the torsion spring of the wire-spring retained heatsink into the associated hook on the assembly on which the wire-spring retained heatsink is being attached.

16. The wire-spring retained heatsink installation and removal tool of claim 1, wherein the shaped portion and the cylindrical portion are part of an interchangeable bit that slides into a receiving portion of the handle.

17. The wire-spring retained heatsink installation and removal tool of claim 1, wherein the cylindrical portion is permanently coupled to the handle.

* * * * *